United States Patent [19]

Kinjo et al.

[11] Patent Number: 5,402,312
[45] Date of Patent: Mar. 28, 1995

[54] APPARATUS HAVING A PRINTED CIRCUIT BOARD ASSEMBLY

[75] Inventors: Morishige Kinjo; Akimitu Ohmori, both of Tokyo, Japan

[73] Assignee: Kabushiki Kaisha Toshiba, Kawasaki, Japan

[21] Appl. No.: 250,954

[22] Filed: May 27, 1994

Related U.S. Application Data

[63] Continuation of Ser. No. 109,467, Aug. 20, 1993, abandoned, which is a continuation of Ser. No. 892,133, Jun. 2, 1992, abandoned.

[30] Foreign Application Priority Data

Jun. 21, 1991 [JP] Japan ................... 3-150080
Apr. 10, 1992 [JP] Japan ................... 4-090858

[51] Int. Cl.6 .................................................. H05K 7/20
[52] U.S. Cl. .................................. 361/695; 165/104.33
[58] Field of Search ........................ 165/80.3, 104.33; 361/687–697, 796, 784, 752, 724–727

[56] References Cited

U.S. PATENT DOCUMENTS

| | | | |
|---|---|---|---|
| 4,502,100 | 2/1985 | Greenspan et al. | 361/695 |
| 4,662,830 | 5/1987 | Pottebaum | 361/695 |
| 4,728,160 | 3/1988 | Mondor et al. | 361/380 |
| 4,899,254 | 2/1990 | Ferchau et al. | 361/384 |
| 4,931,904 | 6/1990 | Yiu | 361/384 |
| 4,967,155 | 10/1990 | Magnuson | 361/384 |

Primary Examiner—Gregory D. Thompson
Attorney, Agent, or Firm—Finnegan, Henderson, Farabow, Garrett & Dunner

[57] ABSTRACT

A printed circuit board assembly is stored in a frame. The printed circuit board assembly comprises at least a mother board and printed circuit boards. The mother board is provided with board-insertion connectors and a fan separately. The printed circuit boards are laminated and disposed on the mother board. First and second feed/exhaust units are arranged through the printed circuit board assembly. The first feed/exhaust unit feeds air between the laminated printed circuit boards in a first direction perpendicular to the direction of lamination of the laminated printed circuit boards. The second feed/exhaust unit feeds air outside the endmost printed circuit board of the laminated printed circuit boards in a second direction perpendicular to the direction of lamination of the laminated printed circuit boards, the second direction extending through the fan.

19 Claims, 6 Drawing Sheets

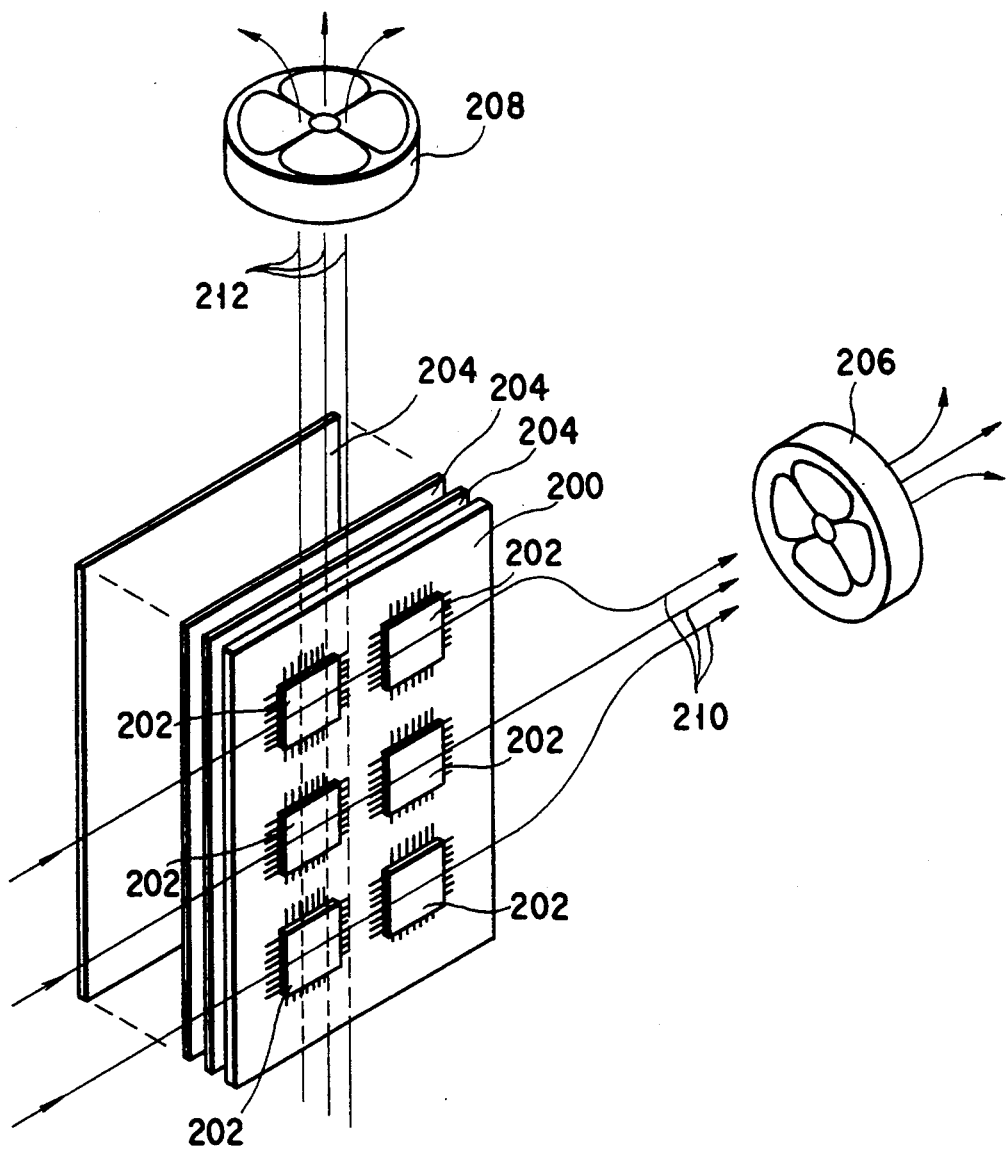
F I G. 1

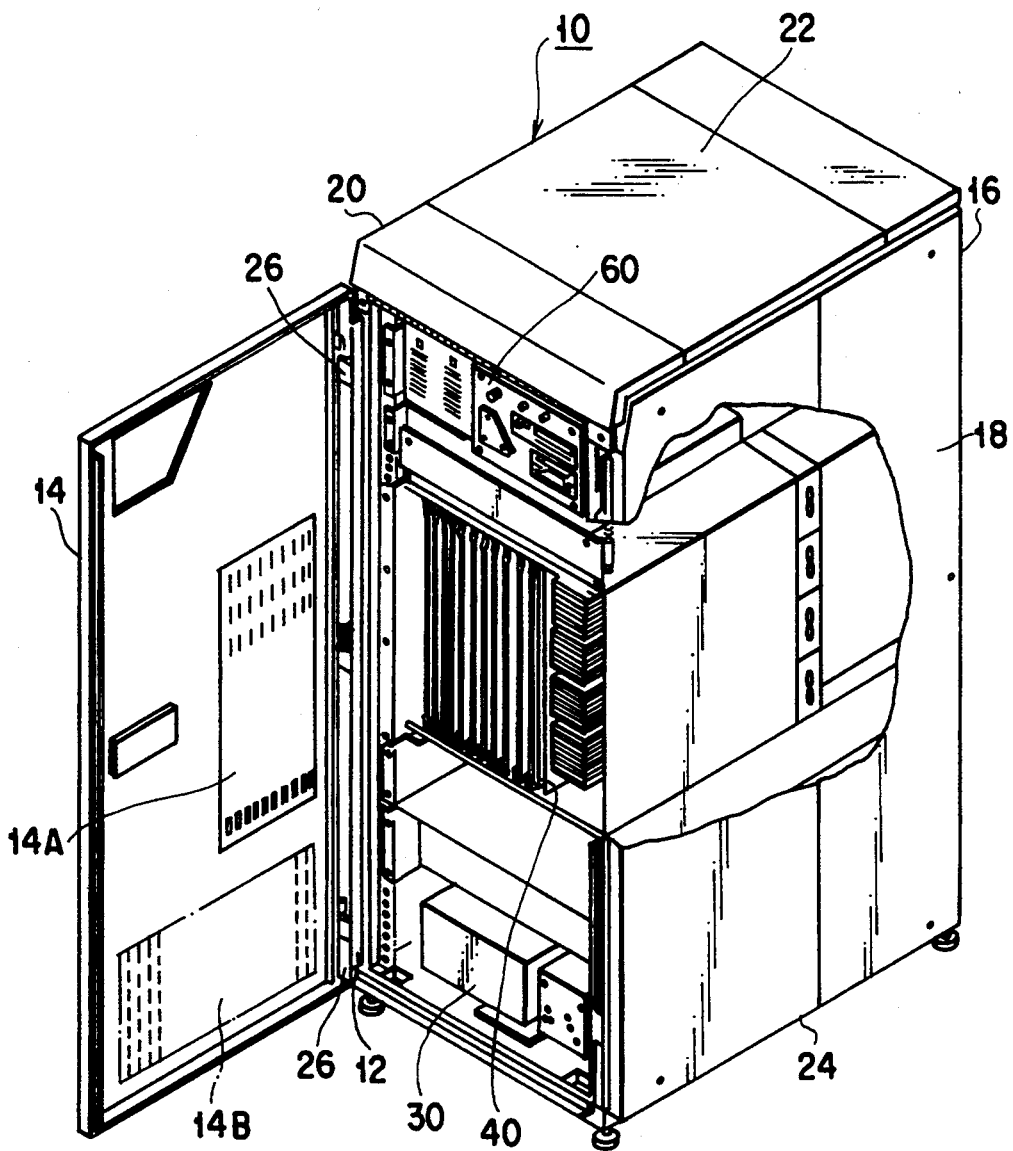
F I G. 2

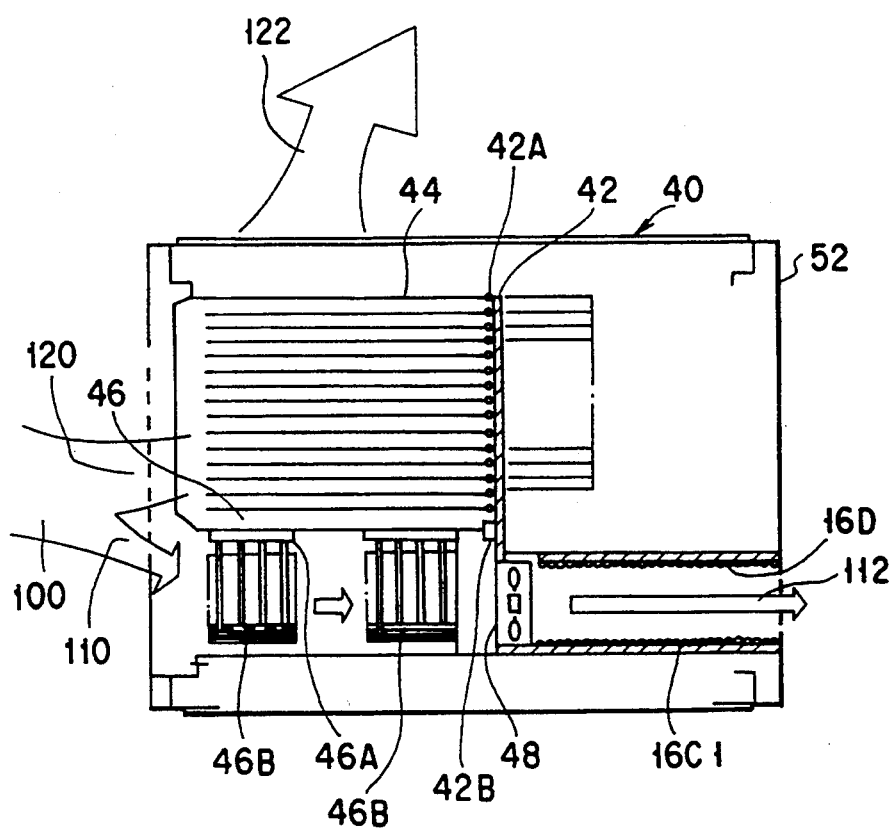
F I G. 5

APPARATUS HAVING A PRINTED CIRCUIT BOARD ASSEMBLY

This application is a continuation of application Ser. No. 08/109,467, filed Aug. 20, 1993, now abandoned, which is a continuation of Ser. No. 07/892,133, filed Jun. 2, 1992, now abandoned.

BACKGROUND OF THE INVENTION

1. Field of the Invention

The present invention relates generally to an apparatus having a printed circuit board assembly, and more particularly to a cooling structure for an apparatus such as a central processing unit (CPU) of a computer system.

2. Description of the Related Art

Electrical and electric equipment such as a CPU comprises a housing, a printed circuit board assembly stored in the housing, a power supply, etc. The printed circuit board assembly includes at least one high-heat-generating board (typically, a CPU board) and at least one non-high-heat-generating board (typically, a memory board).

In this type of electrical and electric equipment, higher integration density of which has been demanded, the printed circuit board assembly has a mother board for supporting printed circuit boards. The mother board is provided with a number of board-insertion connectors. Each connector of the mother board receives a printed circuit board. The mother board functions as means for gathering the high-heat-generating and non-high-heat-generating boards. By this structure, a number of printed circuit boards are attached to the surface of the mother board in a laminated manner, and the assembly of the printed circuit boards realizes higher integration density of various electric circuits such as a CPU, a memory, an interface, etc.

In this electrical and electric equipment, the printed circuit board assembly constitutes a predetermined electric circuit. In order to make the electric circuit function according to specifications, it is necessary to provide suitable cooling means.

Conventional cooling means for the printed circuit board assembly has, for example, the following structure. An air suction unit is provided on a panel of a housing, and a fan is provided at the top of the housing. According to this structure, an air stream can be produced forcibly in the housing, and the printed circuit board assembly mounted within the housing can be cooled by the air stream. According to another example of the conventional cooling means, a fan is provided at the top portion of the housing or at the bottom portion of the housing, or at both the top and bottom portions. By this structure, the air taken in by the fan can be applied directly to the printed circuit board assembly within the housing.

The above conventional cooling means is suitable when printed circuit boards having the same heat-generation characteristics are uniformly cooled. However, it is not suitable for the structure wherein a large-sized rectangular printed circuit board is used or only a specified printed circuit board has a high integration density and high heat generation characteristic.

The drawbacks in the prior art will now be explained in detail. Generally, a printed circuit board assembly includes a mother-board. The mother board functions to gather signal lines and power supply lines of printed circuit boards. The number of signals transmitted between printed circuit boards has recently been increased in accordance with the enhancement of functions of the printed circuit boards. Similarly, the number of board-insertion connectors for connection between the printed circuit boards and mother board has increased more and more.

Each printed circuit board of the printed circuit board assembly has generally a rectangular shape, with a longer side put in contact with the mother board, as the number of signals transmitted between the printed circuit board and other printed circuit boards and mother board has increased.

On the other hand, with development of integrated circuit techniques and a demand for reduction in circuit size, there is a tendency that a greater number of circuits are integrated in a small device. In this case, a device in which many circuits are operated at high speed generates a large quantity of heat, and a printed circuit board with such a device also generates a large quantity of heat. This tendency is most conspicuous in a CPU board. Of all printed circuit boards, the CPU board generates the largest quantity of heat, and the other boards (typically, memory boards) generate less heat.

According to the structure of conventional cooling means, an air suction unit is provided on a panel of a housing and a fan is provided at a top portion of the housing; thus, an air stream is forcibly produced within the housing and the printed circuit board assembly in the housing is cooled by the air stream. Alternatively, a fan may be provided at a bottom portion of the housing and air taken in by the fan is directly applied to the printed circuit board assembly within the housing.

When such conventional cooling means is applied to the electrical and electric equipment having large rectangular printed circuit boards or printed circuit boards some of which have a high integration density and high heat generation characteristic, the cooling efficiency lowers and a local heat-accumulation phenomenon occurs.

Specifically, since the fan is situated within the housing which defines a limited space, the size (performance) of the fan capable of being mounted in the electrical and electric equipment is naturally limited. Accordingly, a part of a general printed circuit board assembly, which requires cooling particularly, and another part thereof, which does not require cooling particularly, are similarly cooled. Consequently, since the fan with a limited performance is used, the part of the printed circuit board assembly which requires cooling particularly is not sufficiently cooled.

In an air cooling system, heat generated by a printed circuit board is absorbed and carried by an air stream flowing above the printed circuit board. Thus, a large quantity of heat can be absorbed and carried from the upstream side of the printed circuit boards.

However, since the air stream is warmed, only a small quantity of heat is absorbed and carried from the downstream side of the printed circuit boards. In particular, when an air stream is let to flow in the longitudinal direction of large rectangular printed circuit boards, there is a large influence of a heat-accumulation phenomenon in the downstream side of the printed circuit boards.

Means for overcoming this drawback is the structure wherein an air stream is let to flow in the transverse direction of the rectangular printed circuit board at the longitudinal end portion thereof. However, because of the presence of the mother board, it is difficult to provide an air passage in the transverse direction, and this means is difficult to realize.

Under the circumstances, in order to reduce the influence of the heat-accumulation phenomenon in the downstream side of the printed circuit boards, a fan having a high performance is required. However, as stated above, the size (performance) of the fan is limited since it is mounted in the housing.

SUMMARY OF THE INVENTION

The object of the present invention is to provide an apparatus having a printed circuit board assembly with a cooling structure capable of effectively cooling the printed circuit board assembly.

This object can be achieved by an apparatus having a printed circuit board assembly, comprising a housing having an internal predetermined space; at least one printed circuit board situated within the predetermined space, the printed circuit board having a first surface on which a device to be cooled is mounted and a second surface opposite to the first surface; and cooling means for feeding a cooling medium in a first direction along the first surface of the printed circuit board and in a second direction along the second surface of the printed circuit board, the second direction being different from the first direction.

The object can also be achieved by an apparatus having a printed circuit board assembly, comprising: a housing having a front panel with an air suction portion, a rear panel with an air exhaust portion, a first side panel, a second side panel, a bottom panel and a top panel, and having an internal predetermined space; a printed circuit board assembly situated in the predetermined space and having at least a plurality of first printed circuit boards, a least one second printed circuit board, a fan, and a mother board, said first printed circuit boards being oriented in a predetermined direction and situated perpendicularly to the mother board, said fan disposed on the mother board separately from the first printed circuit boards, and said second printed circuit board being disposed on the mother board between the first printed circuit boards and the fan; a first air passage for feeding air substantially vertically within said predetermined space, said first air passage directing air from the air suction portion so that air passes between the first printed circuit boards and is exhausted from the air exhaust portion; and a second air passage for feeding air substantially horizontally within said predetermined space, said second air passage directing air from the air suction portion so that air passes along the second printed circuit board, passes through the fan, and exhausts from the air exhaust portion.

The object can also be achieved by an apparatus having a printed circuit board assembly, comprising: a housing having a front panel with an air suction portion, a rear panel with a first air exhaust portion and a second air exhaust portion, a first side panel, a second side panel, a bottom panel and a top panel, and having an internal predetermined space; a printed circuit board assembly situated in the predetermined space and having a plurality of first printed circuit boards with non-high-heat-generating devices, at least one second printed circuit board with a high-heat-generating device, a high-temperature air exhaust fan, a mother board and a non-high-temperature air exhaust fan, said mother board situated within said predetermined space at a predetermined distance from the rear panel and in parallel to the rear panel, said first printed circuit boards being situated perpendicularly to the mother board at a predetermined distance in parallel to the first and second side panels, said high-temperature air exhaust fan disposed on the mother board separately from the first printed circuit boards, said second printed circuit board being disposed on the mother board between the first printed circuit boards and said high temperature in exhaust fan, and said non-high-temperature air exhaust fan being situated near the second printed circuit board; a first air passage for feeding air substantially vertically within said predetermined space, said first air passage directing air from the air suction portion so that air passes between the first printed circuit boards and is exhausted from the first air exhaust portion through the non-high-temperature air exhaust fan; and a second air passage, provided with a sound absorption material, for feeding air substantially horizontally within said predetermined space said second air passage directing air from the air suction portion so that air passes along the second printed circuit board, is drawn through the high-temperature air exhaust fan, and exhausts the air from the second air exhaust portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic perspective view for illustrating the principle of the present invention;

FIG. 2 is a perspective view showing the front side of an apparatus having a printed circuit board assembly according to an embodiment of the invention;

FIG. 5 is a cross-sectional view taken along line V—V in FIG. 4; and

DETAILED DESCRIPTION OF THE PREFERRED EMBODIMENTS

Figure 3:
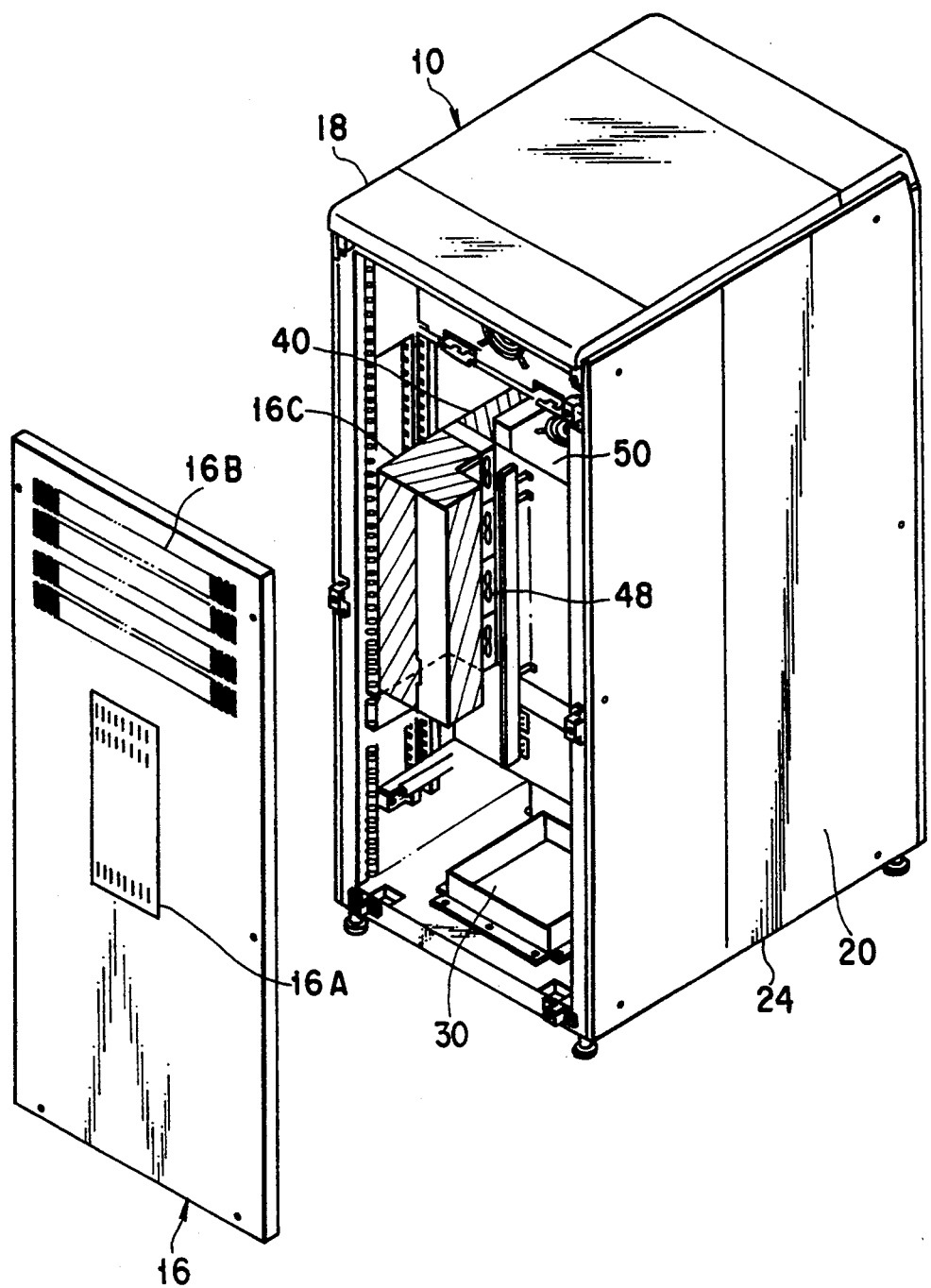
FIG. 3 is a perspective view showing the rear side of the apparatus shown in FIG. 2.

The principle of the present invention will now be explained with reference to FIG. 1. As is shown in FIG. 1, a printed circuit board assembly includes a CPU board 200, which is a high-heat-generation board. The printed circuit board assembly is situated within a housing (not shown). The CPU board 200 is connected to a connector (not shown) of a mother board (not shown). CPU chips 202 are mounted on one surface (hereinafter referred to as "first surface") of the CPU board 200. Memory boards 204 or non-high-heat-generation boards are arranged at regular intervals on the side of the surface (hereinafter referred to as "second surface") of the CPU board 200 which is opposite to the first surface on which the CPU chips 202 are mounted. The memory boards 204 are connected to connectors (not shown) of the mother board (not shown). A high-temperature air exhaust fan 206 is situated at a given position in a plane including the first surface of the CPU board 200, and a non-high-temperature air exhaust fan 208 is situated at a given position in a plane including the second surface of the CPU board 200. A high-temperature air passage 210 is formed along the first surface of the CPU board 200, and a non-high-temperature air passage 212 is formed along the second surface of the CPU board 200. The high-temperature air passage 210 extends, for example, in the vertical direction, and the non-high-temperature air passage 212 extends, for example, in the horizontal direction. The passages 210 and 212 do not intersect with each other.

According to the above structure, different air streams can be let to flow along the first and second surfaces of the CPU board 200. Thus, the CPU chips 202 and memory boards 204 can effectively be cooled by different air streams.

When the rear surface of the printed circuit board is cooled by air streams (wind) flowing in the same direction, the temperature is low on the upstream side of the printed circuit board and it is high on the downstream side. Since the position of the rear surface of the circuit board on the downstream side does not change, the cooling on the downstream side becomes insufficient. By contrast, in the present invention, both surfaces of the printed circuit board are cooled by two air streams (wind) flowing in different directions. Thus, the above problem is solved to a certain extent. Specifically, the downstream side is situated at different portions on the rear surface of the circuit board. In addition, since the mother board is situated at the region where the downstream side of the front surface and the downstream side of the rear surface are close to each other, the heat of this region diffuses to the mother board. Thus, this region is effectively cooled.

An apparatus having a printed circuit board assembly according to an embodiment of the invention will now be described with reference to the accompanying drawings. As is shown in FIG. 2, a housing 10 has a hexahedral frame 12 to form an internal hexahedral space. The hexahedral frame 12 is provided with a front panel 14, a rear panel 16, a right panel 18, a left panel 20, a top panel 22 and a bottom panel 24. The front panel 14 is openably attached to the frame 12 via hinges 26. The rear panel 16, side panels 18 and 20 and top panel 22 are fixed to the frame 12 by screws (not shown).

A power supply unit 30 is situated below the frame 12, and a printed circuit board assembly 40 including a high-temperature air passage and a non-high-temperature air passage is situated at a middle part of the frame 12. A control unit 60 including key switches and a floppy disc drive is situated at the upper part of the frame 12. The power supply unit 30, printed circuit board assembly 40 and control unit 60 do not adjoin one another, and spaces are provided therebetween.

An air suction window 14A for feeding cooling air to the printed circuit board assembly 40 is formed at a middle part of the front panel 14, and an air suction window 14B for feeding cooing air to the power supply unit 30, etc. is formed at a lower part of the front panel 14.

On the other hand, as is shown in FIG. 3, a high-temperature air exhaust window 16A for exhausting high-temperature air from the high-temperature air passage of the printed circuit board assembly 40 is formed at a middle part of the rear panel 16. A non-high-temperature air exhaust window 16B for exhausting non-high-temperature air from the non-high-temperature air passage of the printed circuit board assembly 40 and from the power supply unit 30, etc. is formed at an upper part of the printed circuit board assembly 40.

An exhaust duct 16C1 for guiding, without leak, the high-temperature air from the printed circuit board assembly 40 to the high-temperature air exhaust window 16A is provided between the printed circuit board assembly 40 and the high-temperature air exhaust window 16A. The exhaust duct 16c1 has a linear shape.

The high-temperature air passage of the printed circuit board assembly 40 extends substantially horizontal along the right panel 18. The non-high-temperature air passage extends substantially in an L-shape from the front panel 14 towards the top panel 22. The beginning portion of the high-temperature air passage coincides substantially with that of the non-high-temperature air passage at the high-temperature air exhaust window 16A.

As has been described above, a high-temperature air passage system including the high-temperature air passage of the printed circuit board assembly 40 and a non-high-temperature air passage system including the non-high-temperature air passage of the printed circuit board assembly 40 are formed between the air suction window 14A, on the one hand, and the high-temperature air exhaust window 16A and non-high-temperature air exhaust window 16B, on the other.

A negative pressure is created by fans 48 and 50 of the printed circuit board assembly 40 in the high-temperature air passage system including the high-temperature air passage of the printed circuit board assembly 40. By the negative pressure, air is sucked from the air suction window 14A. The sucked air is passed through the high-temperature air passage system including the high-temperature air passage of the printed circuit board assembly 40 and exhausted from the high-temperature air exhaust window 16A. In addition, the sucked air is passed through the non-high-temperature air passage system including the non-high-temperature air passage of the printed circuit board assembly 40 and exhausted from the non-high-temperature air exhaust window 16B.

Figure 4:
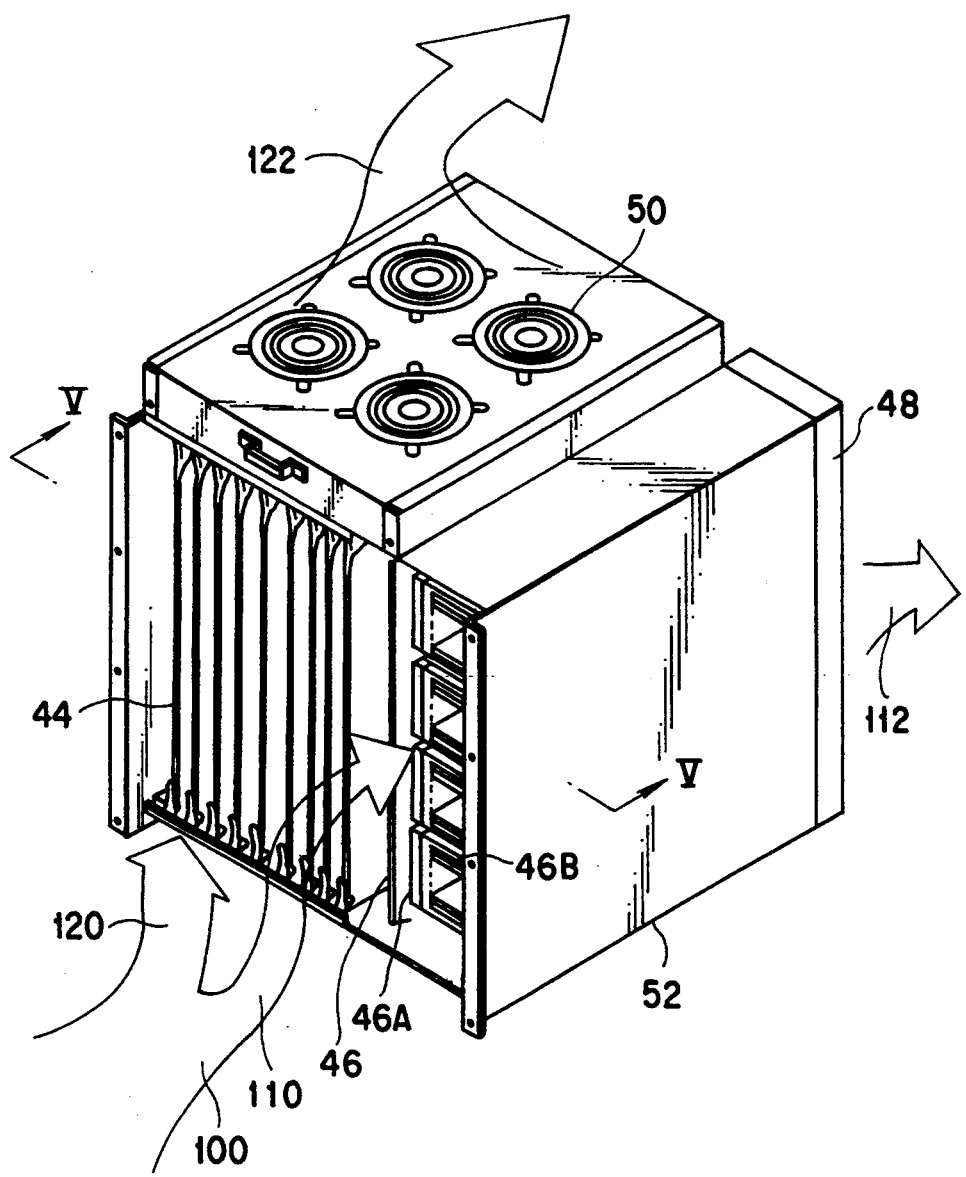
FIG. 4 is a perspective view showing a printed circuit board assembly stored in the apparatus shown in FIG. 2.

The details of the printed circuit board assembly 40 will now be described with reference to FIGS. 4 and 5. The printed circuit board assembly 40 comprises, as shown in FIGS. 4 and 5, a mother board 42, non-high-heat-generating boards 44, a high-heat-generating board 46, high-temperature air fans 48, non-high-temperature air fans 50, and a printed circuit board assembly frame 52 for assembling these parts.

The mother board 42 is situated to face the rear panel 16. The mother board 42 is provided with connectors 42A for insertion of non-high-heat generating boards, a connector 42B for insertion of one high-heat-generating board, and high-temperature air fans 48, separately.

The connectors 42A are gathered on one side (near the left panel 20) of the mother board 42, such that the longitudinal direction of the connectors 42A coincides with the vertical direction of the frame 12.

The high-temperature air fans 48 are arranged on the other side (near the right panel 18) of the mother board 42. Accordingly, the high-temperature air fans 48 are situated at a middle point in the depth direction of the housing 10.

The connector 42B is positioned near the fans 48, and its longitudinal direction coincides with the vertical direction of the frame 12.

The non-high-heat generating boards 44 are inserted in the connectors 42A, and the high-heat generating board 46 is inserted in the connector 42B. The boards 44 and 46 are arranged to face the side panels 18 and 20.

For example, semiconductor memory devices are mounted on the non-high-heat generating boards 44, and high-heat-generating semiconductor devices 46A such as CPU devices are mounted on the high-heat-generating board 46. The board 46 is provided with heat sinks 46B for cooling the high-heat-generating semiconductor devices 46A. Each heat sink 46B is formed by laminating metal plates with high heat conductivity. The metal plates face one another and the top panel 24.

The exhaust duct 16C1 has an internal linear high-temperature air passage. A sound absorption material 16D is provided on the inner wall of the air passage. One opening portion of the air passage of the exhaust duct 16C1 looks to the high-temperature air fans 48, and the other opening portion looks to the high-temperature air exhaust window 16A.

The non-high-temperature air fans 50 are arranged at the top portion of the printed circuit board assembly frame 52, and create a negative pressure in the non-high-temperature air passage for passing air for cooling the non-high-heat-generating boards 44.

According to this embodiment with the above structure, the non-high-heat-generating boards 44 and high-heat-generating board 46 of the printed circuit board assembly 40 can be cooled by different air streams flowing through the printed circuit board assembly 40. In FIGS. 4 and 5, reference numeral 100 denotes an air stream entering from the air suction window 14A, numeral 110 an air stream flowing through the high-temperature air passage system, and numeral 120 an air stream flowing through the non-high-temperature air passage system.

Specifically, a negative pressure is created by the fans 48 and 50 of the printed circuit board assembly 40 in the high-temperature air passage system including the high-temperature air passage of the printed circuit board assembly 40. Air is sucked from the air suction window 14A by the negative pressure. The sucked air is passed through the high-temperature air passage system including the high-temperature air passage of the printed circuit board assembly 40 and exhausted from the high-temperature air exhaust window 16A. Similarly, the sucked air is passed through the non-high-temperature air passage system including the non-high-temperature air passage of the printed circuit board assembly 40 and exhausted from the non-high-temperature air exhaust window 16B.

The high-temperature air passage of the printed circuit board assembly 40 is formed substantially horizontally in the space on the side of the high-heat-generating board 46. Thus, the high-heat-generating board 46, on which the high-heat-generating semiconductor devices with heat sinks 46B are mounted, can effectively be cooled by the air stream of the high-temperature air passage system.

In addition, the non-high-temperature air passage of the printed circuit board assembly 40 is formed substantially vertically in the space between each pair of adjacent non-high-heat-generating boards 44. Thus, the non-high-heat-generating board 44, on which the semiconductor memory devices are mounted, can effectively be cooled by the air stream of the non-high-temperature air passage system which is formed separately from the high-temperature air passage system within the printed circuit board assembly 40.

Further, the air stream of the high-temperature air passage system is determined by the performance of the high-temperature air fans 48, and the air stream of the non-high-temperature air passage system is determined by the performance of the non-high-temperature air fans 50. Thus, these air streams are determined individually. Accordingly, the fans 48 and 50 suitable for the non-high-heat-generating board 44 and high-heat-generating board 46 can be used, and optimal cooling operations can be performed.

Figure 6:
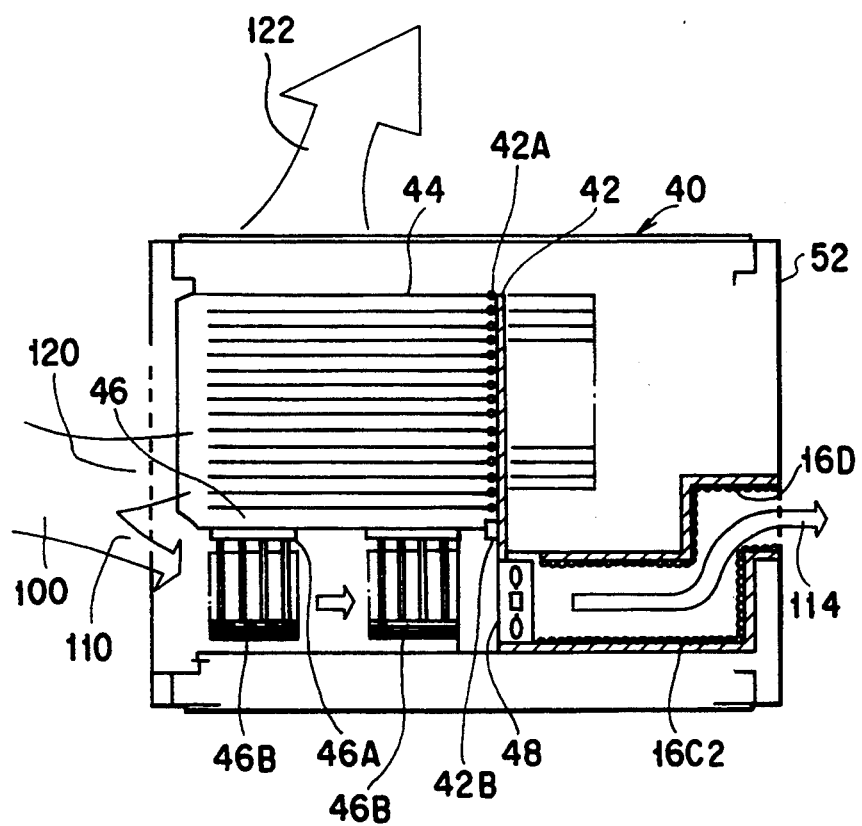
FIG. 6 is a cross-sectional view showing a modification of the printed circuit board assembly shown in FIG. 5.

In the above embodiment, the exhaust duct 16C1 has a linear shape; however, as shown in FIG. 6, an exhaust duct 16C2 having substantially an L-shape can be used. Since the exhaust duct 16C2 has a substantially L-shaped high-temperature air passage. Since the exhaust duct 16C2 has a longer sound propagation distance, noise of the high-temperature air fans 48 which may be louder than that of the non-high-temperature air fans 50, is effectively damped. Thus, low-noise electrical and electric equipment can be provided. In addition, since a sound absorption material 16D is provided on the inner wall of the high-temperature air passage, noise is further damped.

The number of the non-high-heat-generating board 44 or high-heat-generating board 46 may be freely chosen. The shape of the exhaust duct 16C1 or high-temperature air passage may also be freely chosen.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus having a printed circuit board assembly, comprising:
   a housing having an internal predetermined space;
   at least one printed circuit board, situated within the predetermined space, having one surface on which a device to be cooled is mounted and an opposite surface;
   a first passage for directing only a first flow of cooling medium in a first direction substantially parallel to the one surface of the printed circuit board;
   a second passage for directing only a second flow of cooling medium in a second direction substantially parallel to the opposite surface of the printed circuit board;
   means for causing the first cooling medium flow and for causing the second cooling medium flow, the first cooling medium flow being independent of the second cooling medium flow; and
   wherein the first direction is different from the second direction.

2. The apparatus of claim 1 wherein the first direction is substantially perpendicular to the second direction.

3. The apparatus of claim 1 wherein the cooling medium is air.

4. The apparatus of claim 3 wherein the means for causing includes a fan for each of the first cooling medium flow and the second cooling medium flow.

5. The apparatus according to claim 1, further comprising a plurality of printed circuit boards arranged on the side of the opposite surface of said printed circuit board.

6. The apparatus according to claim 1, further including a sound absorption material situated in the first passage.

7. An apparatus having a printed circuit board assembly, comprising:
   a housing having a front panel with an air suction portion, a rear panel with an air exhaust portion, a first side panel, a second side panel, a bottom panel and a top panel, and having an internal predetermined space;
   a printed circuit board assembly situated in the predetermined space and having at least a plurality of first printed circuit boards, a least one second printed circuit board, a fan, and a mother board, said first printed circuit boards being oriented in a predetermined direction and situated perpendicularly to the mother board, said fan disposed on the mother board separately from the first printed circuit boards, and said second printed circuit board being disposed on the mother board between the first printed circuit boards and the fan;
   a first air passage for feeding air substantially vertically within said predetermined space, said first air passage directing air from the air suction portion so that air passes between the first printed circuit boards and is exhausted from the air exhaust portion; and
   a second air passage for feeding air substantially horizontally within said predetermined space, said second air passage directing air from the air suction portion so that air passes along the second printed circuit board, passes through the fan, and exhausts from the air exhaust portion.

8. The apparatus according to claim 7, wherein said fan is disposed at a predetermined distance from the rear panel.

9. The apparatus according to claim 7, wherein said second air passage has a sound absorption material at least on the downstream side of the fan.

10. The apparatus according to claim 7, wherein said second air passage has a bent portion at least on the downstream side of the fan.

11. The apparatus according to claim 7, wherein said second air passage has a sound absorption material and a bent portion at least on the downstream side of the fan.

12. The apparatus according to claim 7, wherein each of said first printed circuit boards has at least one non-high-heat-generating device.

13. The apparatus according to claim 7, wherein said second printed circuit board has at least one high-heat-generating device.

14. The apparatus according to claim 13, wherein said high-heat-generating device is provided with a heat sink.

15. The apparatus according to claim 7, wherein said printed circuit board assembly includes a second fan for forcibly exhausting air flowing through the first air passage to the air exhaust portion.

16. The apparatus according to claim 7, wherein said air exhaust portion comprises a first air exhaust portion for exhausting air from the first air passage and a second air exhaust portion for exhausting air from the second air passage.

17. The apparatus according to claim 7, wherein said second printed circuit board is detachably connected to the mother board.

18. The apparatus according to claim 7, wherein said second printed circuit board and said mother board are detachably connected by a board-insertion connector.

19. An apparatus having a printed circuit board assembly, comprising:
   a housing having a front panel with an air suction portion, a rear panel with a first air exhaust portion and a second air exhaust portion, a first side panel, a second side panel, a bottom panel and a top panel, and having an internal predetermined space;
   a printed circuit board assembly situated in the predetermined space and having a plurality of first printed circuit boards with non-high-heat-generating devices, at least one second printed circuit board with a high-heat-generating device, a high-temperature air exhaust fan, a mother board and a non-high-temperature air exhaust fan, said mother board situated within said predetermined space at a predetermined distance from the rear panel and in parallel to the rear panel, said first printed circuit boards being situated perpendicularly to the mother board at a predetermined distance in parallel to the first and second side panels, said high-temperature air exhaust fan disposed on the mother board separately from the first printed circuit boards, said second printed circuit board being disposed on the mother board between the first printed circuit boards and said high-temperature air exhaust fan, and said non-high-temperature air exhaust fan being situated near the second printed circuit board;
   a first air passage for feeding air substantially vertically within said predetermined space, said first air passage directing air from the air suction portion so that air passes between the first printed circuit boards and is exhausted from the first air exhaust portion through the non-high-temperature air exhaust fan; and
   a second air passage, provided with a sound absorption material, for feeding air substantially horizontally within said predetermined space, said second air passage directing air from the air suction portion so that air passes along the second printed circuit board, is drawn through the high-temperature air exhaust fan, and exhausts from the second air exhaust portion.

* * * * *